(12) United States Patent
Foust et al.

(10) Patent No.: US 7,534,635 B1
(45) Date of Patent: May 19, 2009

(54) GETTER PRECURSORS FOR HERMETICALLY SEALED PACKAGING

(75) Inventors: Donald Franklin Foust, Glenville, NY (US); Linda Ann Boyd, Malta, NY (US); Anil Raj Duggal, Niskayuna, NY (US); Qinglan Huang, Niskayuna, NY (US); Larry Neil Lewis, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/053,772

(22) Filed: Mar. 24, 2008

(51) Int. Cl.
*H01L 21/00* (2006.01)
*H01L 29/207* (2006.01)
*B32B 9/00* (2006.01)

(52) U.S. Cl. ............... 438/25; 438/26; 428/690; 257/100; 257/433

(58) Field of Classification Search ............... None
See application file for complete search history.

(56) References Cited

U.S. PATENT DOCUMENTS

| | | | |
|---|---|---|---|
| 3,582,702 A * | 6/1971 | Almer | 313/558 |
| 4,768,292 A | 9/1988 | Manzei | |
| 5,141,671 A | 8/1992 | Bryan et al. | |
| 5,150,006 A | 9/1992 | Van Slyke et al. | |
| 5,151,629 A | 9/1992 | VanSlyke | |
| 5,294,870 A | 3/1994 | Tang et al. | |
| 5,405,709 A | 4/1995 | Littman et al. | |
| 5,484,922 A | 1/1996 | Moore et al. | |
| 5,593,788 A | 1/1997 | Shi et al. | |
| 5,645,948 A | 7/1997 | Shi et al. | |
| 5,683,823 A | 11/1997 | Shi et al. | |
| 5,755,999 A | 5/1998 | Shi et al. | |
| 5,928,802 A | 7/1999 | Shi et al. | |
| 5,935,720 A | 8/1999 | Chen et al. | |
| 6,020,078 A | 2/2000 | Chen et al. | |
| 6,226,890 B1 | 5/2001 | Boroson et al. | |
| 6,284,342 B1 * | 9/2001 | Ebisawa et al. | 428/69 |
| 6,465,953 B1 | 10/2002 | Duggal | |
| 6,888,307 B2 | 5/2005 | Silvernail et al. | |
| 7,459,220 B2 * | 12/2008 | Hikmet et al. | 428/690 |
| 2003/0203551 A1 | 10/2003 | Cok et al. | |
| 2005/0238908 A1 | 10/2005 | Hikmet et al. | |
| 2007/0075628 A1 | 4/2007 | Lewis et al. | |
| 2008/0226902 A1 * | 9/2008 | Giannantonio et al. | 428/336 |

FOREIGN PATENT DOCUMENTS

| | | | |
|---|---|---|---|
| EP | 1021070 A1 * | 7/2000 | |
| JP | 09148066 A * | 6/1997 | |
| JP | 10275679 A * | 10/1998 | |
| WO | WO 02 27812 A1 | 4/2002 | |
| WO | WO 2004 072604 A2 | 8/2004 | |

* cited by examiner

*Primary Examiner*—Alonzo Chambliss
(74) *Attorney, Agent, or Firm*—Mary Louise Gioeni

(57) ABSTRACT

Hermetically sealed packages include a getter precursor disposed within an interior region of the package. The getter precursor includes a cation portion and a non-oxidizing anion portion, which is configured to thermally decompose to change an oxidation state of cation to zero. Also disclosed herein are processes for hermetically sealing a package by coating a solution of the getter precursor onto interior defining wall surface of the package.

10 Claims, 1 Drawing Sheet

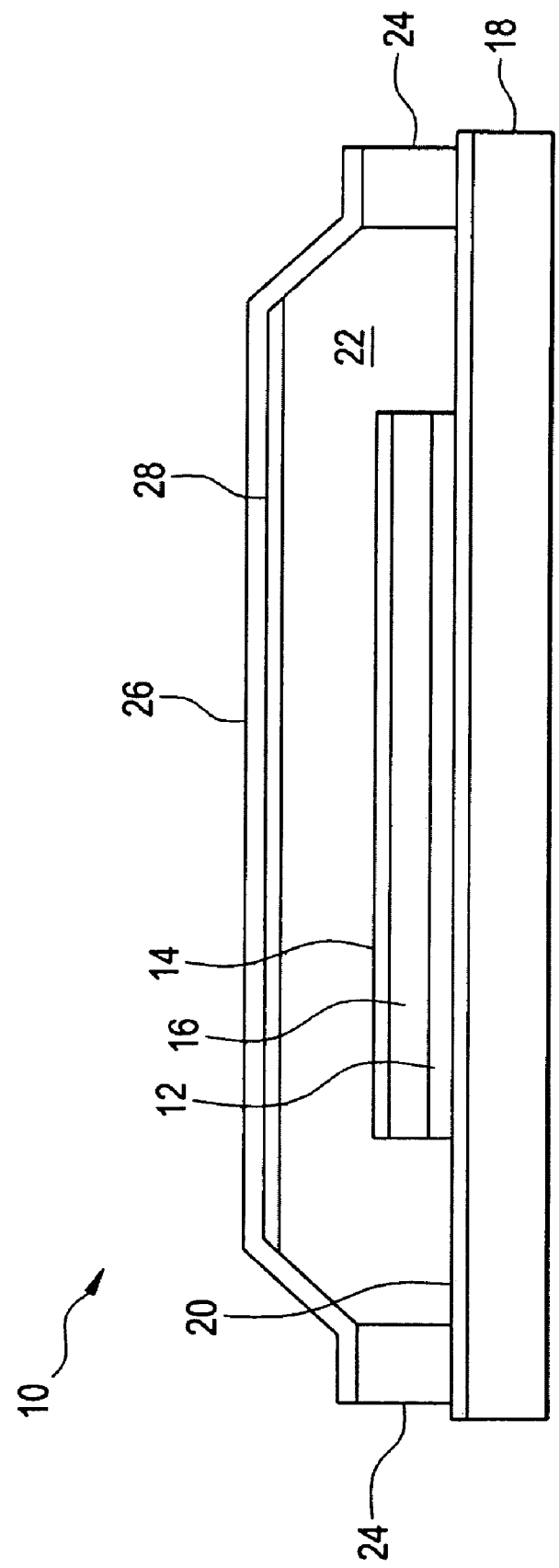

GETTER PRECURSORS FOR HERMETICALLY SEALED PACKAGING

GOVERNMENT RIGHTS

The U.S. Government may have certain rights in this invention pursuant to contract number 70NANB3H3030 awarded by the National Institute of Standards and Technology (NIST).

BACKGROUND

The present disclosure generally relates to getter precursors for hermetically sealed packaging.

Hermetically sealed packages for devices such as optoelectronic devices are often designed to protect their contents from the external environment. Most of these devices are made of a layered structure incorporating different layers of materials each having diverse functionalities. One common way to protect these devices includes providing encapsulation to the layered structure. Typically, the procedure to encapsulate the device includes sandwiching the device between a substrate and an encapsulation layer such that there is a continuous perimeter seal around the device. While glass and metal provide excellent protection, they are often lacking in terms of cost, weight, ruggedness, and/or transparency. Plastics offer these latter attributes, but lack hermeticity. Barriers can be added to limit moisture and oxygen ingress; however the addition of scavengers can improve performance. In addition, all substrates (metal, glass, and plastic) are typically assembled using organic-based adhesives, often based on epoxies. These adhesives become pathways for moisture and oxygen ingress. Addition of getters to the package is often disposed within the package to minimize any degradation effects caused by moisture and/or oxygen permeation.

Getter materials incorporated into packages generally fall into 2 categories: already active materials and precursors to active materials. Already active materials include certain reactive metals and their alloys along with molecular compounds. Because of their reactivity to moisture and/or oxygen, these materials must be processed under inert conditions. Precursors to getters can be processed in the air, but require activation prior to incorporation into the package. Since activation of these prior art precursors often results in expulsion of oxygen and/or water, activation cannot occur within the package. Once activated, these materials must be handled under inert conditions.

Exemplary prior art getter materials include metal oxides, alkaline earth metal oxides, sulfates, metal halides, or perchlorates, molecular sieves, alumina, auxite, clays, silica gets, various zeolites, and the like. While these materials are satisfactory for their intended purpose, they do require special handling and processes for incorporation into the package.

Accordingly, there exists a need for improved materials and methods for incorporating getters into the package.

BRIEF SUMMARY

The present disclosure is directed to hermetically sealed packages and processes for hermetically sealing a package that includes a getter precursor. In one embodiment, the hermetically sealed package comprises a getter precursor disposed within an interior region of the package, the getter precursor comprising an alkali metal cation or an alkaline earth metal cation and a non-oxidizing anion, wherein the getter precursor is capable of reducing the alkali or the alkaline earth metal cations upon thermal decomposition.

A process for hermetically sealing a package comprises applying a getter precursor to an interior defining wall surface of the package, wherein the getter precursor comprises an alkali metal cation or an alkaline earth metal cation and a non-oxidizing anion portion; and heating the getter precursor to a temperature effective to thermally decompose the getter precursor and reduce the alkali metal cation or an alkaline earth metal cation.

The disclosure may be understood more readily by reference to the following detailed description of the various features of the disclosure and the examples included therein.

BRIEF DESCRIPTION OF THE DRAWINGS

The FIGURE below, wherein like elements are numbered alike, are for illustrative purposes only.

The FIGURE depicts a cross sectional view of an exemplary encapsulated OLED device package including a getter precursor in accordance with one embodiment of the disclosure.

DETAILED DESCRIPTION

The present disclosure is generally directed to getter precursors for packaging. As will be described herein, the getter precursors are substantially air stable and eliminate the need for inert atmosphere processing. Also disclosed herein are processes for incorporating the getter precursors directly into a package and subsequently activating the desiccant within the package. As used herein the term getter, also referred to as a desiccant, is generally defined as a chemical agent that reacts with water (moisture) and/or oxygen. Although specific reference will be made to its use with optoelectronic devices such as organic light emitting diode (OLED) devices, it should be apparent that the getter precursors can be utilized in a wide range of packaging applications where moisture and/or oxygen removal is desirable. The getter precursor is not intended to be limited to organic electronic devices and as such can be used in any packaging application wherein activating the getter precursor after packaging is desirable. These applications include, but are not limited to, applications such as micro-electro-mechanical sensors (MEMS) devices, flat panel displays, field emission displays, plasma displays, charge coupled devices, and the like.

The getter precursors for water and/or oxygen sorption are salts that generally include a cation portion and an anion portion that is selected to be non-oxidizing. In one embodiment, the salts are water stable and can be applied to a desired substrate surface as an aqueous solution. The getter precursors are configured to thermally decompose and form the respective metal in its zero oxidation state, which can then be used to react with any residual moisture and/or oxygen within the package or moisture and/or oxygen that permeates into the package. In some embodiments, the thermal decomposition of these materials can be supplemented with other forms of energy (e.g., X-rays, ultraviolet light) to facilitate decomposition. In some embodiments, the thermal decomposition temperature of the getter precursor is less than 200° C. In another embodiment, the getter precursor thermally decomposes at a temperature from 100 to 200° C.; and in still another embodiment, the getter precursor is selected to thermally decompose at 100° C. to 180° C. Depending on the application, higher and or lower temperatures can be used. For example, higher decomposition temperatures can be used if the components within the package are thermally stable. In this manner, the getter precursor can be handled in ambient conditions, packaged, and subsequently activated by thermally decomposing the getter precursor to form the respective alkali and/or alkaline earth metal. The resulting metal reacts with the moisture and/or oxygen in a well known manner.

In one embodiment, the cation portion includes alkali and alkaline earth metals such as barium (Ba), calcium (Ca), lithium (Li), sodium (Na), magnesium (Mg), and the like. These metals chemically react with and destroy oxygen and water as opposed to a simple absorption mechanism such as may be the case with molecular sieves and silica gel, for example. Advantageously, the reactive getters as opposed to absorber getters tend to provide lower residual moisture and oxygen levels. It should also be noted that the products of the reactive metal can be used to further react with moisture and oxygen contaminants. Using barium metal as an example, the following reactions are possible, wherein the products can further react with water, for example, to further reduce residual moisture levels:

$$Ba + 2H_2O \rightarrow Ba(OH)_2 + H_2$$

$$2Ba + O_2 \rightarrow 2BaO$$

$$BaO + H_2O \rightarrow Ba(OH)_2$$

$$Ba(OH)_2 + 8H_2O \rightarrow Ba(OH)_2 \cdot 8H_2O$$

The anion portion is formed of a non-oxidizing material such as a hydride, an organometallic compound, a nitrogen containing species such as azides and nitrides, derivatives thereof, and the like. By way of example, the getter precursor can be Group IA or Group IIa metal azide. An azide based getter precursor forms nitrogen gas and the corresponding metal upon heating. Exemplary azide precursors include, but are not limited to, barium azide ($BaN_6$), calcium azide ($CaN_6$), ($SrN_6$), sodium azide ($NaN_3$), and the like. The thermal decomposition temperatures for various metal azides generally vary from about 110° C. to about 360° C. For applicability to the present disclosure, the azides are selected to have a thermal decomposition temperature less than 200° C.

Suitable organometallics release the cation metal in its zero oxidation state upon heating. In one embodiment, the getter precursor is of formula $R_2M$, wherein M is the alkali or alkaline earth metal and R is an aliphatic or aromatic radical. Non-limiting examples of such organometallic compounds include cyclopentadienyl derivatives of alkaline-earth metals such as bis(tetra-1-propyl-cyclopentadienyl)barium, bis(tetra-1-propyl-cyclopentadienyl)calcium, bis(penta-isopropylcyclopentadienyl)M, where M is calcium, barium or strontium and bis(tri-t-butylcyclopentadienyl)M, where M is calcium, barium or strontium and fluorenyl derivatives of alkaline earth metals, such as bis(fluorenyl)calcium or bis(fluorenyl)barium.

Suitable hydrides include simple binary hydrides as well as ternary and other complex hydrides. Exemplary binary hydrides include, without limitation, sodium hydride (NaH), potassium hydride (KH), magnesium hydride ($MgH_2$) and he like. Exemplary complex hydrides include, without limitation, lithium aluminum hydride ($LiAlH_4$), sodium borohydride ($NaBH_4$), and the like. The hydrides decompose to the respective nascent metal and hydrogen.

Optionally, the getter precursor is irradiated prior to or simultaneous with thermal decomposition. It has been found that thermal decomposition can be accelerated by the irradiation from sources such as exposure to ultraviolet light, electron bombardment, X-rays, gamma rays, and the like.

In one embodiment, the getter precursor is dissolved to form a solution that is then applied to an interior surface of the package. Once hermetically sealed within the package, the getter precursor is heated to thermally decompose the anion portion and reduce the cation to form the reactive metal getter. Typically, it is desirable to employ the maximum amount of getter (in order to maximize the ability of the substrate to scavenge for water and/or oxygen) without causing a substantial diminution in desired physical properties of the substrate material. By way of example, in some OLED devices, maximum transparency is desirable. In these types of embodiments, the transparency of the substrate including the getter precursor is typically chosen such that less than 50% of the light emitted by the OLED is absorbed in the substrate and preferably less than 10%. Other types of applications may require different transparency requirements. To aid in the coating of the getter precursor, a film-forming agent can be added to the aqueous solution. Examples of such agents are water-soluble polymers such as poly ethylene imine and polyethylene glycol.

In other embodiments, mixtures of the getter precursor are applied to the substrate surfaces or alternatively, selected portions of the interior defining surfaces of the package are coated with one type of getter precursor and other portions are coated with a different getter precursor. The number of getter precursors applied within the package as a mixture or on selected portions is not intended to be limited.

Referring now to FIG. 1, an exemplary package may include an optoelectronic device that is prone to moisture and/or oxidative degradation. An exemplary optoelectronic device is an OLED device 10, which is provided for illustrative purposes only. The getter precursors can be used in any packaging application wherein activating the getter precursor after packaging is desirable. The OLED device 10 generally includes an anode 12, a cathode 14 spaced from anode 12, and an organic light emitting layer 16 disposed between the anode and the cathode, all of which are disposed on a base substrate 18. An optional barrier film 20 may be on at least one surface of the substrate 18 so as to substantially prevent moisture and/or oxygen from entering an interior region 22 of the OLED device 10. The optional barrier film 20 can be intermediate to the substrate and the light emitting components as shown (i.e., the anode, cathode and light emitting layer) or disposed on a backside of the substrate. To provide hermiticity around a perimeter of the light emitting components, a sealant 24 is deposited about the edge or alternatively, may be deposited as a solid fill. A protective substrate/layer 26 is coupled to the base substrate 18 by the sealant.

In one embodiment, the getter precursor 28 can be coated onto any interior defining surface of defined by an interior region of the package. For example, the getter precursor can be applied to any portion of the protective layer 26, i.e., within pockets created upon coupling the protective substrate 26 to the base substrate 18. Since the getter precursor is applied as a solution rather than as a dispersion, the resulting getter after heat treatment provides substantially greater transparency. Because of this, the location of the getter precursor can be placed anywhere in the device, including, but not limited to, over active zones, on cathode and anode surfaces, directly over transparent OLEDs, and the like. A power source (not shown) is attached to the anode and cathode. It will be understood that the relative locations of the anode and cathode may be reversed with respect to the substrate 18 if the structure of the multiple layers that define the organic light emitting layer 16 is likewise reversed, and the top-most electrode is sufficiently transparent. The substrate 18 may further include electrical connections, power conditioning components, mounting components for attachment to a surface, or the like.

The optional barrier coating 20 may be disposed at a thickness in the range of approximately 10 nm to about 10,000 nm, and preferably in the range of approximately 10 nm to about 1,000 nm. Suitable barrier coating compositions include organic, inorganic, or ceramic materials. The materials are reaction or recombination products of reacting plasma species and are deposited onto the surface of the flexible substrate. Suitable organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Suitable inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is well within the skills of the artisans. A graded composition of the coating can be obtained by changing the compositions of the reactants fed into the reactor chamber during the deposition of reaction products to form the coating.

Further, the barrier coating may comprise hybrid organic/inorganic materials or multilayer organic/inorganic materials. The organic materials may comprise acrylates, epoxies, epoxyamines, xylenes, siloxanes, silicones, etc. The choice of the particular reactants can be appreciated by those skilled in the art. Most metals may also be suitable for the barrier coating in applications where transparency of the flexible substrate is not required. As can be appreciated, a flexible substrate may comprise a composition, which incorporates the barrier coating to provide a hermetic substrate.

The emitting layer 16 of the OLED device generally includes a luminescent or fluorescent material where electroluminescence is produced as a result of electron-hole pair recombination in this region and is configured to emit light, wherein the particular spectrum is not intended to be limited and will generally depend on the intended application. The light-emitting layer can be comprised of a single material or multiple materials. For example, the light-emitting layer may include a host material doped with a guest compound or compounds where light emission comes primarily from the dopant and can be of any color. The host materials in the light-emitting layer can be an electron-transporting material, a hole-transporting material, or another material or combination of materials that support hole-electron recombination. Likewise, to generate the desired spectrum, the light emitting layer may include one or more emitters. For example, if white light emission is desired, the light emitting layer 16 may include first and second emitters that emit complementary, or nearly complementary colors. The combination of light emission between the two complementary colors can be selected to cover most of the visible spectrum in order to produce useful white light. For example, the first light emitter can emit yellow and the second light emitter can emit blue. Other combinations such as red and cyan are possible. Emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; 6,020,078; and 6,534,199.

Common materials useful for the anode 12 are indium-tin oxide and tin oxide, but other suitable metal oxides include, but are not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. Desired anode materials can be deposited by any suitable way such as evaporation, sputtering, chemical vapor deposition, or electrochemical means. In addition, ultra-thin metal films can be used by themselves or in combination of one of the previous layers to decrease the sheet resistance. Anode materials can be selectively deposited or patterned using well-known photolithographic and/or printing processes.

Cathode 14 is spaced apart from anode 12. For applications where the cathode materials should be transparent or substantially transparent to the emission of interest, metals, if used, should be thin or one should use transparent conductive oxides, or include these materials. When light emission is through the anode 12, the cathode 14 material can be comprised of nearly any conductive material. When needed, patterning can be achieved through many well-known methods including, but not limited to, through-mask deposition, integral shadow masking, laser ablation, and selective chemical vapor deposition. The cathode can be deposited by evaporation, sputtering, or chemical vapor deposition. Desirable materials have effective film-forming properties to ensure effective contact with the underlying organic layer, promote electron injection at low voltage, and have effective stability. Useful cathode materials often contain a low work function metal (<3.0 eV) or metal alloy. Another suitable class of cathode materials includes bilayers comprised of a thin layer of a low work function metal or metal salt capped with a thicker layer of conductive metal.

The base substrate 18 of the package can be an organic solid, an inorganic solid, or include organic and inorganic solids. Likewise, the substrate can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Likewise the substrate can be a homogeneous mixture of materials, a composite of materials, or multiple layers of materials. The substrate can either be light transmissive or opaque, depending on the intended application. For example, in the exemplary OLED application, light transmissivity of the substrate may be desirable for viewing the electroluminescent emission through the substrate. Transparent glass or plastic is commonly employed in such cases. For applications where the emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices.

The materials that define the substrate 18 are not intended to be limited. For the exemplary OLED application, suitable substrate materials include, but are not limited to, polyethyleneterephthalate ("PET"); polyacrylates; polycarbonate; silicone; epoxy resins; silicone-functionalized epoxy resins; polyester such as Mylar (made by E. I. du Pont de Nemours & Co.); polyimide such as Kapton H or Kapton E (made by du Pont), Apical AV (made by Kanegafugi Chemical Industry Company), Upilex (made by UBE Industries, Ltd.); polyethersulfones ("PES," made by Sumitomo); polyetherimide such as Ultem (made by SABIC Innovative Plastics, LLC); and polyethylenenaphthalene ("PEN"). The substrate can be selected to be relatively rigid or may be flexible depending on the particular application.

The protective substrate 26, once sealed to the substrate 18 provides complete enclosure. In the OLED application discussed above, the protective substrate completely encloses the light emitting components (i.e., anode, cathode, and light emitting layer). The protective substrate 26 may or may not be transparent, and may be any material depending on the application. For the OLED application, the protective substrate 26 may comprise a reflective material, such as a metal foil, to reflect light produced by the organic electronic device. The protective substrate 26 for the packaged OLED device may also comprise aluminum foil, stainless steel foil, copper foil, tin, Kovar, Invar, and the like. In applications where reflective light is less critical, the protective substrate 26 may comprise thin glass, sapphire, mica or coated plastics having a low permeability. Alternatively, the same materials that define the base substrate can be used of the protective substrate.

The sealant 24 comprises an adhesive material such that it may be implemented to couple the base substrate 18 to the protective substrate 26, thereby completely enclosing the organic electronic device. Accordingly, the sealant 26 may comprise epoxies, acrylates, Norland 68 UV curables, thermally curable adhesives, pressure sensitive adhesives, such as thermosets and thermal plastics such as co-polymers of ethylene and acrylic acid (Primacor made by Dow Chemical) or room temperature vulcanized (RTV) adhesives, for instance. The sealant 26 generally comprises any material having a low permeability and providing adhesion.

The disclosure is explained in more detail with reference to the following non-limiting Examples, which are only illustrative, but not limitative.

EXAMPLES

An OLED was prepared on a glass-based substrate by patterning a deposited layer of ITO, depositing electro-active organic layers and depositing a cathode. In parallel, a cathode barrier was prepared by spin-coating a 100 nanometer thick layer of barium azide onto a 75 micron thick aluminum foil using a 10% aqueous solution of barium azide containing 1% poly ethylene glycol (Molecular weight 35,000). The coating was dried by baking it at 100° C. for 10 minutes in a convection oven. This layered structure was transferred into an inert atmosphere glovebox and heated to 175° C. for 10 minutes, thereby converting the barium azide to barium metal and nitrogen gas. A 40 micron thick film of Primacor 59801 (a co-polymer of ethylene and acrylic acid manufactured by Dow Chemical) was laminated onto this barrier. This structure was then laminated at 100° C. onto the glass substrate containing the OLED.

In a related example, an OLED was prepared on a glass-based substrate by patterning a deposited layer of ITO, depositing electro-active organic layers and depositing a cathode. In parallel, a cathode barrier was prepared by spin-coating a 100 nanometer thick layer of barium azide onto a 75 micron thick aluminum foil using a 10% aqueous solution of barium azide containing 1% poly ethylene glycol (Molecular weight 35,000). The coating was dried by baking it at 100° C. for 10 minutes in a convection oven. A 40 micron thick film of Primacor 59801 (a co-polymer of ethylene and acrylic acid manufactured by Dow Chemical) was laminated onto this barrier. This composite film was transferred into an inert glove box and laminated at 100° C. onto the glass substrate containing the OLED. This layered structure was heated to 175° C. for 10 minutes, thereby converting the barium azide to barium metal and nitrogen gas.

Advantageously, the getter precursors as described above can be incorporated into a hermetically sealed package at ambient conditions without the need for an inert atmosphere. In addition, the getter precursor material can be applied over large areas (field v. perimeter). For optoelectronic application such as the OLED discussed above, the getter precursor can be configured to provide high transparency, can be applied on both cathode and anode sides of device; and can be applied directly over transparent OLEDs.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A process for hermetically sealing a package, the process comprising:
    applying a getter precursor to an interior defining wall surface of the package, wherein the getter precursor comprises an alkali metal cation or an alkaline earth metal cation and a non-oxidizing anion portion; and
    heating the getter precursor to a temperature effective to thermally decompose the getter precursor and reduce the alkali metal cation or an alkaline earth metal cation.

2. The process of claim 1, further comprising exposing the getter precursor to radiation prior to or simultaneous with heating.

3. The process of claim 1, wherein the non-oxidizing anion portion is an organometallic group.

4. The process of claim 1, wherein the non-oxidizing anion portion is an azide.

5. The process of claim 1, wherein the non-oxidizing anion portion is a hydride.

6. The process of claim 1, wherein coating a solution of the getter precursor comprises applying the coating in atmospheric air.

7. The process of claim 6, wherein the solution is an aqueous solution.

8. The process of claim 1, wherein the temperature effective to thermally decompose the getter precursor is less than 200° C.

9. The process of claim 1, wherein the package further comprises an optoelectronic device disposed within the package, wherein the optoelectronic device has an exterior surface that comprises the interior defining wall surface of the package.

10. The package of claim 1, wherein the getter precursor is barium azide.

* * * * *